United States Patent
Wells et al.

(10) Patent No.: US 9,793,881 B2
(45) Date of Patent: Oct. 17, 2017

(54) FLIP-FLOP WITH ZERO-DELAY BYPASS MUX

(71) Applicants: Christina Wells, Austin, TX (US); Matthew Berzins, Cedar Park, TX (US); Min Su Kim, Hwaseong-si, Gyeonggi-do (KR)

(72) Inventors: Christina Wells, Austin, TX (US); Matthew Berzins, Cedar Park, TX (US); Min Su Kim, Hwaseong-si, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 33 days.

(21) Appl. No.: 14/202,821

(22) Filed: Mar. 10, 2014

(65) Prior Publication Data

US 2015/0036447 A1   Feb. 5, 2015

Related U.S. Application Data

(60) Provisional application No. 61/862,249, filed on Aug. 5, 2013.

(51) Int. Cl.
| | |
|---|---|
| *H03K 5/04* | (2006.01) |
| *G11C 29/02* | (2006.01) |
| *G11C 5/14* | (2006.01) |
| *G11C 29/12* | (2006.01) |

(52) U.S. Cl.
CPC ......... *H03K 5/04* (2013.01); *G11C 29/12015* (2013.01)

(58) Field of Classification Search
CPC ........................................................ H03K 5/04
USPC ............................................................ 365/226
See application file for complete search history.

(56) References Cited

U.S. PATENT DOCUMENTS

| | | | |
|---|---|---|---|
| 5,227,674 A | 7/1993 | Takahashi et al. | |
| 5,313,470 A * | 5/1994 | Simpson | G01B 31/318552 714/724 |
| 5,349,255 A * | 9/1994 | Patel | H03K 3/012 327/141 |
| 5,378,934 A * | 1/1995 | Takahashi | G01R 31/31701 327/203 |
| 5,479,127 A * | 12/1995 | Bui | G01B 31/318558 327/142 |
| 5,656,962 A | 8/1997 | Banik | |
| 5,862,373 A * | 1/1999 | Pathikonda | G06F 1/04 710/58 |
| 6,223,313 B1 * | 4/2001 | How | G01B 31/318516 324/750.3 |
| 6,329,867 B1 * | 12/2001 | Penney | G11C 7/1072 326/121 |

(Continued)

*Primary Examiner* — Anthan Tran
*Assistant Examiner* — Mushfique Siddique
(74) *Attorney, Agent, or Firm* — Sughrue Mion, PLLC

(57) ABSTRACT

Exemplary embodiments may disclose a flip-flop circuit for inserting a zero-delay bypass mux including a master circuit which is configured to receive a data input, an input clock signal, and a bypass signal, and output an intermediate signal to a first node; and a slave circuit which is configured to receive the intermediate signal at the first node, the input clock signal, and the bypass signal, and output an output clock signal. The bypass signal controls the slave circuit to output one of a buffered input clock signal and a stretched clock signal as the output clock signal based on a logic level of the bypass signal.

17 Claims, 5 Drawing Sheets

FLIP-FLOP CIRCUIT 100

(56) References Cited

U.S. PATENT DOCUMENTS

| | | | |
|---|---|---|---|
| 6,424,691 B1 * | 7/2002 | Neravetla | H03K 23/54 377/48 |
| 6,483,888 B1 * | 11/2002 | Boerstler | G06F 1/08 327/115 |
| 6,956,405 B2 * | 10/2005 | Lundberg | G06F 9/3869 326/46 |
| 6,959,408 B2 * | 10/2005 | Whetsel | G01R 31/31855 324/750.3 |
| 7,146,549 B2 * | 12/2006 | Kanba | G01R 31/318541 714/726 |
| 7,492,202 B2 * | 2/2009 | Inoue | H03K 3/011 327/112 |
| 7,596,732 B2 * | 9/2009 | Branch | G01R 31/318544 327/202 |
| 7,843,218 B1 * | 11/2010 | Ramaraju | G01R 31/318541 326/38 |
| 8,122,413 B2 * | 2/2012 | Hom | G01B 31/318583 716/104 |
| 8,887,120 B1 * | 11/2014 | Verma | G06F 17/5031 326/101 |
| 2005/0039095 A1 * | 2/2005 | Guettaf | H04N 5/46 714/726 |
| 2006/0107145 A1 * | 5/2006 | Athavale | G01R 31/318594 714/727 |
| 2007/0022339 A1 * | 1/2007 | Branch | G01B 31/318552 714/726 |
| 2007/0063752 A1 * | 3/2007 | Kowalczyk | H03K 3/037 327/202 |
| 2008/0191752 A1 * | 8/2008 | Austin | H03K 5/04 327/115 |
| 2010/0332929 A1 * | 12/2010 | Branch | G01B 31/318536 714/731 |
| 2013/0155781 A1 * | 6/2013 | Kottapalli | H03K 3/012 365/189.05 |
| 2015/0358004 A1 * | 12/2015 | Shirai | H03K 3/356104 327/115 |

* cited by examiner

FLIP-FLOP WITH ZERO-DELAY BYPASS MUX

CROSS-REFERENCE TO RELATED APPLICATION

This application claims priority from U.S. Provisional Application No. 61/862,249, filed on Aug. 5, 2013, the disclosure of which is incorporated herein in its entirely by reference.

BACKGROUND

1. Technical Field

Apparatuses consistent with exemplary embodiments relate to a flip-flop with a zero-delay bypass multiplexer, and more particularly, to a flip-flop with a zero-delay bypass multiplexer which may achieve a design for test (DFT) coverage not incurring an additional delay.

2. Description of the Related Art

In a related art, a master-slave flip-flop configuration is typically used to manipulate a clock input which is fed into at least one memory circuit. For example, the manipulated clock input may be a divided clock or a stretched clock.

However, in the related art, a DFT coverage for the memory circuit may be lost if the clock input is manipulated by the master-slave flip-flop. Therefore, the memory circuit disposed downstream of the related art master-slave flip-flop configuration requires a regular clock input for DFT testing.

In order to address the problem of requiring a regular clock input for DFT of the memory circuit, the related art adds a downstream multiplexer to allow a regular clock to be utilized for DFT testing of the memory circuit. FIG. 1 shows an example of a conventional master-slave flip-flop circuit 10, which provides an output CKm to a conventional bypass multiplexer. The conventional bypass multiplexer is located downstream of the conventional master-slave flip-flop circuit 10, and provides a CKOut signal based on a CK signal, a bypass signal BYP, and the output from the conventional master-slave flip-flop circuit 10. However, adding the downstream multiplexer increases a time delay. The time delay may cause a hold time violation. In this scenario, a hold time violation occurs when the memory circuit receives the regular clock input at a time which violates the timing constraints of the memory circuit. Moreover, the hold time violation may require an additional hold buffer to account for the time delay, such that the regular clock is input within the timing constraints of the memory circuit. Thus, when the downstream multiplexer is added as in the related art, power consumption, timing delay, and circuit size may increase. Additional power consumption, timing delay, and circuit size occur as a result of the downstream multiplexer and the additional hold buffers. Thus, an improved configuration for DFT is needed which does not require increased power consumption, timing delay, and circuit size.

SUMMARY

Exemplary embodiments provide a flip-flop with a zero delay multiplexer such that design for test coverage is achieved without incurring additional delay.

According to an aspect of an exemplary embodiment, there is provided a flip-flop circuit for inserting a zero-delay bypass mux, the flip-flop circuit including a master circuit which may be configured to receive a data input, an input clock signal, and a bypass signal, and output an intermediate signal to a first node; and a slave circuit which may be configured to receive the intermediate signal at the first node, the input clock signal, and the bypass signal, and output an output clock signal. The bypass signal may control the slave circuit to output one of a buffered input clock signal and a stretched clock signal as the output clock signal based on a logic level of the bypass signal.

The master circuit may include a bypass PMOS transistor connected between a first voltage source and a third PMOS transistor, and controlled by the bypass signal; and a bypass NMOS transistor connected between a third node and ground, and controlled by the bypass signal.

The master circuit may further include a first PMOS transistor connected between the first voltage source and the first node, and controlled by the input clock signal; a second PMOS transistor connected between the first voltage source and the first node, and controlled by the second node; a first NMOS transistor connected between the first node and a second NMOS transistor, wherein the first NMOS transistor is controlled by the data input; a third NMOS transistor connected between the second NMOS transistor and the ground, and controlled by the second node; the second NMOS transistor connected between the first NMOS transistor and the third NMOS transistor, and controlled by the input clock signal; the third PMOS transistor connected between the bypass PMOS transistor and a second node, and controlled by the input clock signal; a fourth PMOS transistor connected between the first voltage source and the second node, and controlled by the intermediate signal; a fourth NMOS transistor connected between the first node and a ninth NMOS transistor, and controlled by an inverted signal of the first node; a fifth NMOS transistor connected between the second node and the third node, and controlled by the intermediate signal; a sixth NMOS transistor connected between the third node and a seventh NMOS transistor, and controlled by an inverted signal of the data input; the seventh NMOS transistor connected between the sixth NMOS transistor and the ground, and controlled by the input clock signal; the eighth NMOS transistor connected between the ninth NMOS transistor and the ground, and controlled by the input clock signal; and the ninth NMOS transistor connected between the eighth NMOS transistor and the second node, and controlled by an inverted signal of the second node.

The slave circuit may include a bypass NOR gate which is configured to receive the bypass signal and a signal of a sixth node, and output a signal of a fourth node.

The slave circuit may further include a fifth PMOS transistor connected between the first voltage source and a tenth NMOS transistor, and controlled by the intermediate signal of the first node; the tenth NMOS transistor connected between the fifth PMOS transistor and an eleventh NMOS transistor, and controlled by the input clock signal; the eleventh NMOS transistor connected between the tenth NMOS transistor and ground, and controlled by the intermediate signal; a sixth PMOS transistor connected between the first voltage source and a seventh PMOS transistor, and controlled by the signal of the fourth node; a seventh PMOS transistor connected between the sixth PMOS transistor and a twelfth NMOS transistor, and controlled by the input clock signal; and the twelfth NMOS transistor connected between the seventh PMOS transistor and a fifth node, and controlled by the signal of the fourth node.

The slave circuit may further include an inverter which inverts the signal of the sixth node such that the inverter outputs the output clock signal.

The flip-flop circuit may be used to test at least one external circuit using the output clock signal.

The at least one external circuit may be at least one memory circuit.

In response to the bypass signal being logic high, the master circuit may be disabled, the input clock signal may be buffered, and the buffered clock signal may be output as the output clock signal from the slave circuit.

In response to the bypass signal being logic low, the stretched clock signal may be output as the output clock signal from the slave circuit. The stretched clock signal may be stretched in comparison to the input clock signal.

According to another aspect of an exemplary embodiment, there is provided a method of inserting a zero-delay bypass mux, the method including receiving a data input, an input clock signal, and a bypass signal at a first circuit; outputting an intermediate signal at a first node of the first circuit; receiving the intermediate signal at the first node, the input clock signal, and the bypass signal at a second circuit; and outputting an output clock signal from the second circuit. One of a buffered input clock signal and a stretched clock signal may be output as the output clock signal based on a mode of the first circuit and the second circuit.

The method may further include disabling the first circuit during a bypass mode; buffering the input clock signal in the second circuit during the bypass mode; outputting the buffered input clock signal as the output clock signal from the second circuit during the bypass mode.

The bypass mode may be a mode in which the bypass signal is logic high.

The method may further include outputting the stretched clock signal as the output clock signal from the second circuit during a non-bypass mode, and the stretched clock signal is stretched in comparison to the input clock signal.

The non-bypass mode may be a mode in which the bypass signal is logic low.

The method may further include testing at least one external circuit using the output clock signal.

The at least one external circuit may be at least one memory circuit.

According to yet another exemplary embodiment, there is provided a flip-flop circuit, the flip-flop circuit including a first circuit which receives an input clock signal; and a second circuit which receives the input clock signal and outputs an output clock signal.

The first circuit may include a bypass PMOS transistor connected between a voltage source and a first PMOS transistor, and controlled by the bypass signal, and a bypass NMOS transistor connected between a first NMOS and ground, and controlled by the bypass signal.

The second circuit may include a bypass NOR gate which is configured to receive the bypass signal and a signal of a first node and output a signal of a second node, an inverter which inverts a signal of the first node such that the inverter outputs an output clock signal. The signal of the second node is a control input to a second PMOS transistor and a second NMOS transistor of the second circuit.

The bypass signal may control the second circuit to output one of a buffered input clock signal and a stretched clock signal as the output clock signal based on a logic level of the bypass signal.

In response to the bypass signal being logic low, the stretched clock signal is output at the output clock signal from the second circuit. The stretched clock signal is stretched in comparison to the input clock signal.

In response to the bypass signal being logic high, the first circuit is disabled, the input clock signal is buffered, and the buffered input clock signal is output as the output clock signal from the second circuit.

BRIEF DESCRIPTION OF THE DRAWINGS

Illustrative, non-limiting example embodiments will be more clearly understood from the following detailed description taken in conjunction with the accompanying drawings, in which.

DETAILED DESCRIPTION OF THE EMBODIMENTS

Figure 1:
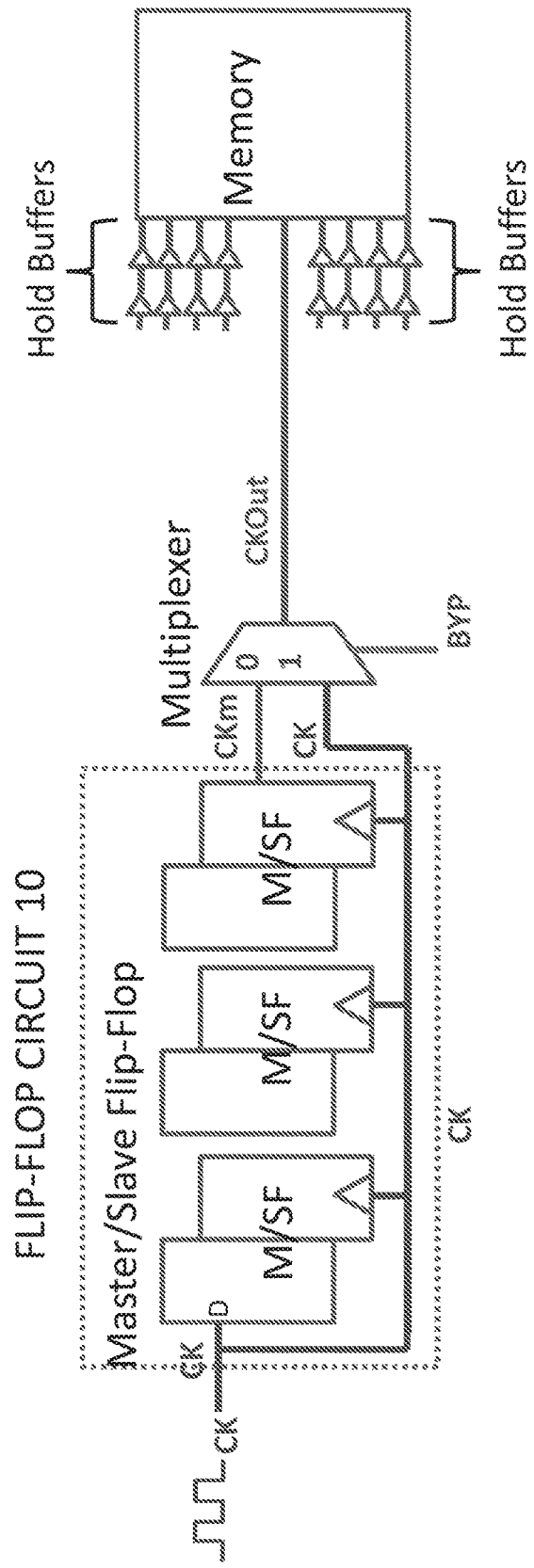
FIG. 1 is a diagram illustrating a design for test configuration in a related art.

Various exemplary embodiments of the inventive concept will be described more fully hereinafter with reference to the accompanying drawings. The inventive concept may, however, be embodied in many different forms and should not be construed as limited to the embodiments set forth herein. Rather, these embodiments are provided such that this disclosure will be thorough and complete, and will fully convey the scope of the inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the embodiments. As used herein, the term "and/or" includes any and all combinations of one or more of the associated listed items.

It will be understood that when an element is referred to as being "connected", "attached", or "coupled" to another element, it can be directly connected, attached, coupled to the other element or intervening elements may be present. In contrast, when an element is referred to as being "directly connected", "directly attached", or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a configuration of DFT of a memory in a related art.

The DFT configuration of FIG. 1 includes a flip-flop circuit 10, a multiplexer 20, a plurality of hold buffers 30 and a memory 40 which is the subject of DFT.

In the DFT configuration of FIG. 1, the flip-flop circuit 10 is constituted by three master-slave flip-flops which are serially disposed. However, this related art flip-flop circuit 10 is illustrated as having three master-slave flip-flops only for the purpose of comparing with a DFT configuration according to an exemplary embodiment of the inventive concept which will be described later. Instead, the related art flip-flop circuit 10 may include more or less than three master-slave flip-flops.

The flip-flop circuit 10 of FIG. 1 receives a clock signal CK as an input to the combination of three master-slave flip-flops. The clock signal CK input to the flip-flop circuit 10 is directly input to the three master-slave flip-flops. The multiplexer 20 is added to select a clock signal. Specifically, the multiplexer 20 receives an output of the flip-flop circuit 10 which is a delayed manipulated clock CKm and the clock input CK. As shown in FIG. 1, the delayed manipulated clock CKm is the input clock signal CK which is manipulated by the master-slave flip flop combinations. The multiplexer 20 selects one of the delayed manipulated clock CKm and the clock input CK based on a bypass enable signal BYP, and outputs the selected clock signal CKout.

In the related art DFT configuration of FIG. 1, although the flip-flop circuit 10 includes a plurality of master-slave flip flop combinations, the flip-flop circuit 10 may include only one master-slave flip-flop combination. Further, the flip-flop circuit 10 of FIG. 1 may receive an input clock signal CK for inputting to the one master-slave flip flop combination.

In the related art DFT configuration of FIG. 1, adding the multiplexer 20 downstream of the flip-flop circuit 10 may cause an additional time delay. The delay may cause a hold time violation. In order to mitigate the hold time violation in FIG. 1, a plurality of hold buffers 30 may be required. Therefore, in the related art DFT configuration of FIG. 1, power consumption, timing delay, and a circuit size may increase.

Figure 2:
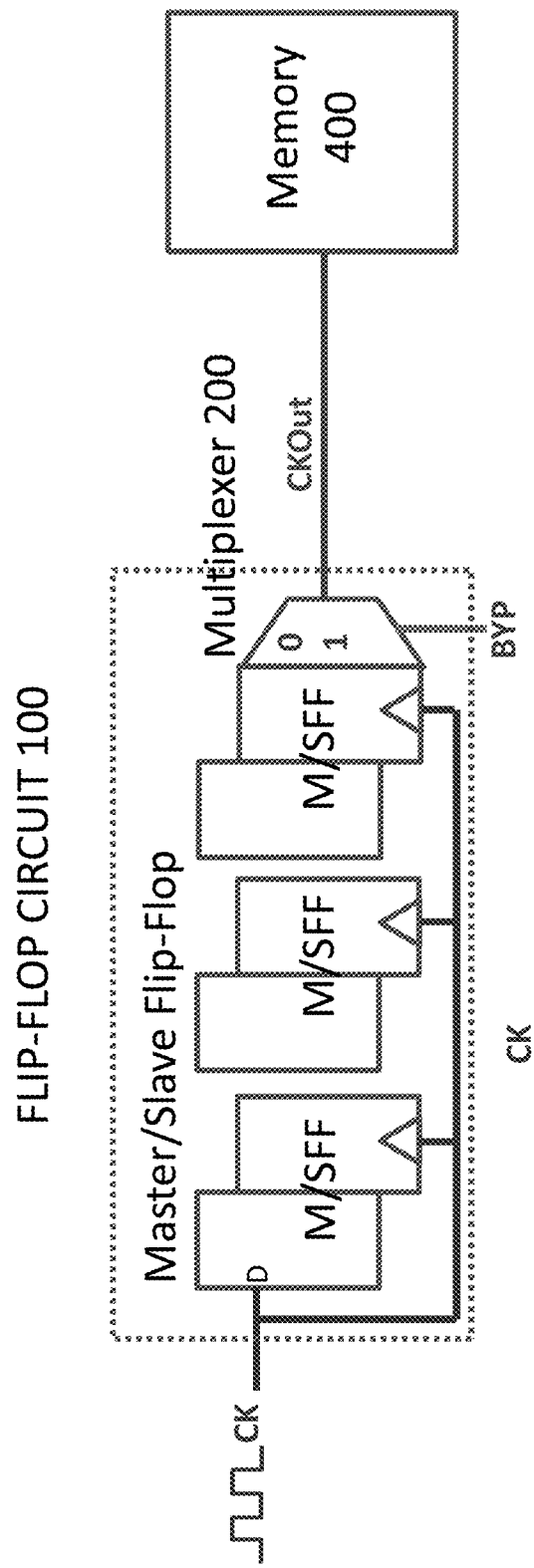
FIG. 2 is a diagram illustrating a design for test configuration according to an exemplary embodiment.

FIG. 2 is a diagram illustrating a DFT configuration according to an exemplary embodiment.

An exemplary embodiment of the DFT configuration of FIG. 2 may include a flip-flop circuit 100, a multiplexer 200, and a memory 400. The memory 400 may be similar to the memory 40 in the related art DFT configuration shown in FIG. 1. Further, the flip-flop circuit 100 may include a plurality of master-slave flip-flop combinations.

In contrast to the related art DFT configuration shown in FIG. 1, the multiplexer 200 in the exemplary embodiment of FIG. 2 may be included in the flip-flop circuit 100. Therefore, the flip-flop circuit 100 of the exemplary embodiment may receive the input clock signal CK and the bypass enable signal BYP, and output the selected clock signal CKout based on the bypass signal. It should be noted that existing related art master-slave flip flop combinations do not allow the multiplexer 200 to be included in the flip-flop circuit 100.

When the multiplexer 200 is implemented within the flip-flop circuit 100 as shown FIG. 2, the additional time delay due to the multiplexer 20 as shown in the related art DFT configuration of FIG. 1 is not incurred. Therefore, in the DFT configuration of FIG. 2, power consumption, timing delay, and a circuit size are not increased. As shown in FIG. 2, since there is no additional delay, the plurality of hold buffers 30 required in the related art DFT configuration of FIG. 1 is not required.

Figure 3:
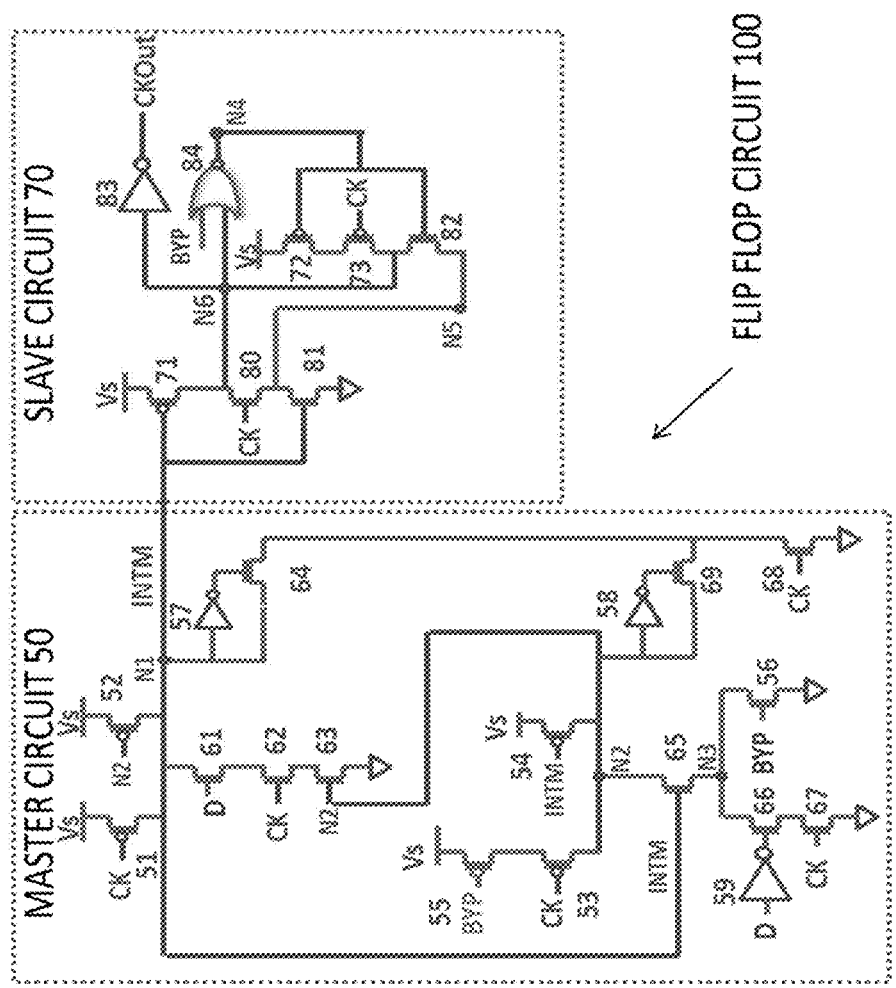
FIG. 3 is a diagram illustrating a flip-flop circuit of FIG. 2, according to an exemplary embodiment.

FIG. 3 is a diagram illustrating a flip-flop circuit of FIG. 2 according to an exemplary embodiment. In particular, FIG. 3 illustrates in detail one master-slave flip-flop combination of the flip-flop circuit 100 of FIG. 2.

In FIG. 3, the flip-flop circuit 100 of FIG. 2 may include a master circuit 50 and a slave circuit 70.

The master circuit 50 may include a plurality of transistors. The master circuit 50 may include a first PMOS transistor 51, a second PMOS transistor 52, a third PMOS transistor 53, and a fourth PMOS transistor 54. Further, the master circuit 50 may include a first NMOS transistor 61, a second NMOS transistor 62, a third NMOS transistor 63, a fourth NMOS transistor 64, a fifth NMOS transistor 65, a sixth NMOS transistor 66, a seventh NMOS transistor 67, an eighth NMOS transistor 68, and a ninth NMOS transistor 69.

Moreover, the master circuit 50 may include a bypass PMOS transistor 55, a bypass NMOS transistor 56, a first inverter 57, a second inverter 58, and a third inverter 59. The master circuit 50 may receive a data input D, the input clock signal CK, the bypass enable signal BYP, and output an intermediate signal INTM to a first node N1.

In particular, the first PMOS transistor 51 of FIG. 3 may be connected between a first voltage source Vs and the first node N1. The second PMOS transistor 52 may also be connected between the first voltage source Vs and the first node N1. The third PMOS transistor 53 may be connected between the bypass PMOS transistor 55 and a second node N2. The fourth PMOS transistor 54 may be connected between the first voltage source Vs and the second node N2.

The bypass PMOS transistor 55 may be connected between the first voltage source Vs and the third PMOS transistor 53. The bypass NMOS transistor 56 may be connected between a third node N3 and ground.

The first NMOS transistor 61 may be connected between the first node and a second NMOS transistor 62. The second NMOS transistor 62 may be connected between the first NMOS transistor 61 and a third NMOS transistor 63. The third NMOS transistor 63 may be connected between the second NMOS transistor 62 and the ground. The fourth NMOS transistor 64 may be connected between the first node and a eighth NMOS transistor 68. The fifth NMOS transistor 65 may be connected between the second node N2 and the third node N3. The sixth NMOS transistor 66 may be connected between the third node N3 and a seventh NMOS transistor 67. The seventh NMOS transistor 67 may be connected between the sixth NMOS transistor 66 and the ground. The eighth NMOS transistor 68 may be connected between a ninth NMOS transistor 69 and the ground. The ninth NMOS transistor 69 may be connected between the second node N2 and the eighth NMOS transistor 68.

The first PMOS transistor 51, the second NMOS transistor 62, the third PMOS transistor 53, the seventh NMOS transistor 67, and the eighth NMOS transistor 68 are all controlled by the input clock signal CK. In other words, the input clock signal CK is input to a gate of these transistors.

The second PMOS transistor 52 and the third NMOS transistor 63 are controlled by the second node N2. In other words, the second node N2 is input to a gate of these transistors. Further, the ninth NMOS transistor 69 is controlled by an inverse of the second node N2 through the second inverter 58.

The first NMOS transistor 61 is controlled by the data input D. In other words, the data input D is input to a gate of the first NMOS transistor 61. Further, the sixth NMOS transistor 66 is controlled by an inverse of the data input D through the third inverter 59.

The fourth PMOS transistor 54 and the fifth NMOS transistor 65 are controlled by the intermediate signal INTM. In other words, the intermediate signal INTM is input to a gate of these transistors. Further, the fourth NMOS transistor 64 is controlled by an inverse of the intermediate signal INTM through the first inverter 57.

The bypass PMOS transistor 55 and the bypass NMOS transistor 56 are controlled by the bypass enable signal BYP.

Although, the master circuit 50 of the flip-flop circuit 100 according to the embodiment is described as above in reference to FIG. 3, the flip-flop circuit 100 is not limited to the above description. In other words, one of ordinary skill in the art could use bypass transistors in a different circuit configuration to achieve the same functions. Further, a different number of transistors may be used, and the circuit configuration may be variously modified to achieve the same functions.

In FIG. 3, the slave circuit 70 of the flip-clop circuit 100 may include a fifth PMOS transistor 71, a sixth PMOS transistor 72, a seventh PMOS transistor 73, a tenth NMOS transistor 80, an eleventh NMOS transistor 81, and a twelfth NMOS transistor 82.

Moreover, the slave circuit 70 may include a fourth inverter 83 and a bypass NOR gate 84. The slave circuit 70 may receive the intermediate signal INTM, the input clock signal CK, the bypass enable signal BYP, and output the output clock signal CKout.

The fifth PMOS transistor 71 may be connected between the first voltage source Vs and a tenth NMOS transistor 80. The sixth PMOS transistor 72 may be connected between the first voltage source Vs and a seventh PMOS transistor 73. The seventh PMOS transistor 73 may be connected between the sixth PMOS transistor 72 and the twelfth NMOS transistor 82.

The tenth NMOS transistor 80 may be connected between the fifth PMOS transistor 71 and the eleventh NMOS transistor 81. The eleventh NMOS transistor 81 may be connected between the tenth NMOS transistor 80 and the ground. The twelfth NMOS transistor 82 may be connected between the seventh PMOS transistor 73 and a fifth node N5.

The bypass NOR gate 84 may be configured to receive a signal of a sixth node N6 and the bypass enable signal BYP, and output a signal to the fourth node N4. The inverter 83 may receive the signal of the sixth node N6, invert the signal of the sixth node N6, and output the inverted signal of the sixth node N6 as the output clock signal CKout.

The seventh PMOS transistor 73 and the tenth NMOS transistor 80 are controlled by the input clock signal CK. In other words, the input clock signal CK is input to a gate of these transistors.

The fifth PMOS transistor 71 and the eleventh NMOS transistor 81 are controlled by the intermediate signal INTM. In other words, the intermediate signal INTM is input to a gate of these transistors.

The sixth PMOS transistor 72 and the twelfth NMOS transistor 82 are controlled by the signal of the fourth node N4. In other words, the signal of the fourth node N4 is input to a gate of these transistors.

Although, the slave circuit 70 of the flip-flop circuit 100 according the embodiment is described as above in reference to FIG. 3, the slave circuit 70 is not limited to the above description. In other words, one of ordinary skill in the art could use bypass transistors in a different circuit configuration to achieve the same functions. Further, a different number of transistors may be used, and the circuit configuration may be variously modified to achieve the same functions.

As shown in FIG. 3, the bypass PMOS transistor 55, the bypass NMOS transistor 56, and the bypass NOR gate 84 are included in the flip-flop circuit 100. When adding these elements in the flip-flop circuit 100, there may be minimal timing degradation. The elements of FIG. 3 only require an additional precharge timing, which is not timing critical. Although not explicitly shown in FIG. 3, a precharge circuit may precharge at least one of the nodes N1-N2 to the voltage source Vs. The precharge circuit may be included in the flip-flop circuit 100, or may precharge from a circuit external to the flip-flop circuit 100. Therefore, the precharge timing does not affect timing critical requirements of the memory circuit which is the subject of the DFT.

In contrast, when a multiplexer is placed downstream of the flip-flop circuit 10 (as shown in the related art DFT configuration in FIG. 1), the complexity of the entire DFT configuration increases. This complexity increases circuit size and power consumption. Further, placing the multiplexer downstream of the flip-flop circuit 10 increases latency. Therefore, in the related art DFT configuration, when placing the multiplexer downstream of the flip-flop circuit 10, hold buffers 30 may be required so that the regular clock input matches the timing critical requirements of the memory circuit which is the subject of the DFT.

Therefore, in the exemplary embodiments, power consumption and timing delay is reduced in comparison to the related art. Further, in the exemplary embodiments, circuit size is not increased in comparison to the related art. Power consumption may be reduced in the exemplary embodiments because the bypass PMOS transistor 55, the bypass NMOS transistor 56, and the bypass NOR gate 84 use the same power as the flip-flop circuit 100. In other words, no additional power may be needed for these elements.

In contrast, in the related art, the multiplexer is placed downstream of the flip-flop circuit 10. Therefore, in the related art, the multiplexer placed downstream of the flip-flop circuit 10 may require additional power.

Figure 4:
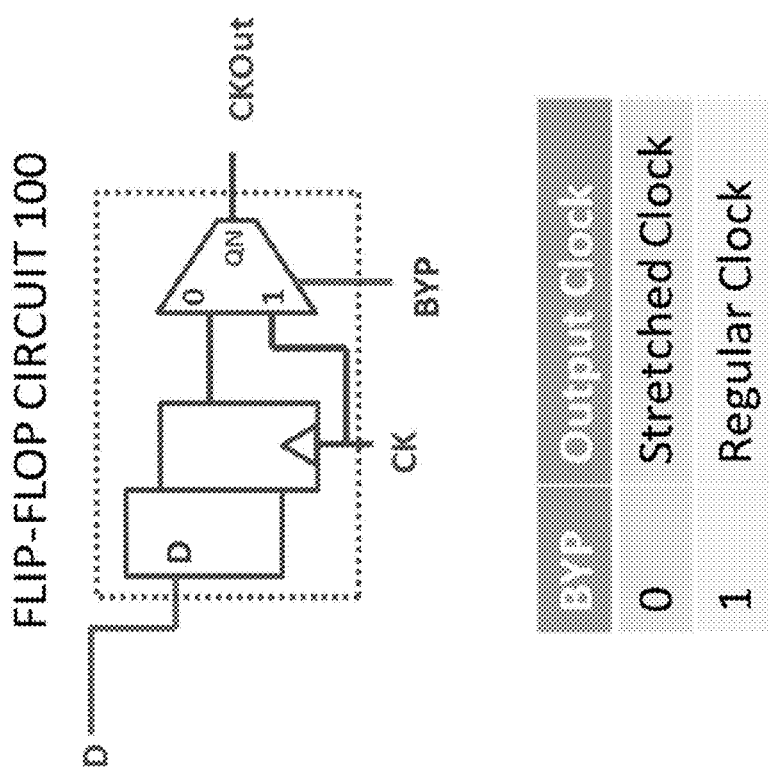
FIG. 4 is a diagram illustrating a high level configuration of the flip-flop circuit of FIG. 3, according to an exemplary embodiment.

FIG. 4 is a diagram illustrating a high level configuration of the flip-flop circuit 100 of FIG. 3, according to an exemplary embodiment.

In FIG. 4, the input clock signal CK and the bypass enable signal BYP may be input to the flip-flop circuit 100. As shown in the high level configuration, the flip-flop circuit 100 outputs the output clock signal CKout based on the input clock signals CK, the data signal D, and the bypass enable signal BYP.

An operation of the DFT configuration will now be described with reference to FIGS. 2-4.

In FIGS. 2-4, when the bypass enable signal BYP is 1, the second node N2 is held low, forcing the intermediate signal INTM to be held high, allowing the input clock signal CK to pass through to the output clock signal CKout. Therefore, in the bypass mode (i.e., the bypass enable signal is logic high, or 1), the clock input passes through the output, allowing for the input clock signal CK to be used in the DFT configuration. In an exemplary embodiment, the input clock signal CK is passed through the output clock signal CKout to test a hardware circuit, such as a memory circuit.

In FIGS. 2-4, when the bypass enable signal BYP is 0 (i.e., not in the bypass mode), the input clock signal CK is manipulated before passing through to the output clock signal CKout. In an exemplary embodiment, the input clock signal CK which is manipulated before passing through to the output is a stretched clock CKm. The stretched clock CKm is stretched in comparison to the input clock signal CK.

Although the flip-flop circuit 100 shown in FIGS. 2-4 is implemented using D type flip-flops according to the above embodiment, the inventive concept is not limited thereto. For example, the flip-flop circuit 100 may be constituted using SR type flip-flops, T type flip-flops, JK type flip-flops, or a combination of any of these flip-flops.

Figure 5:
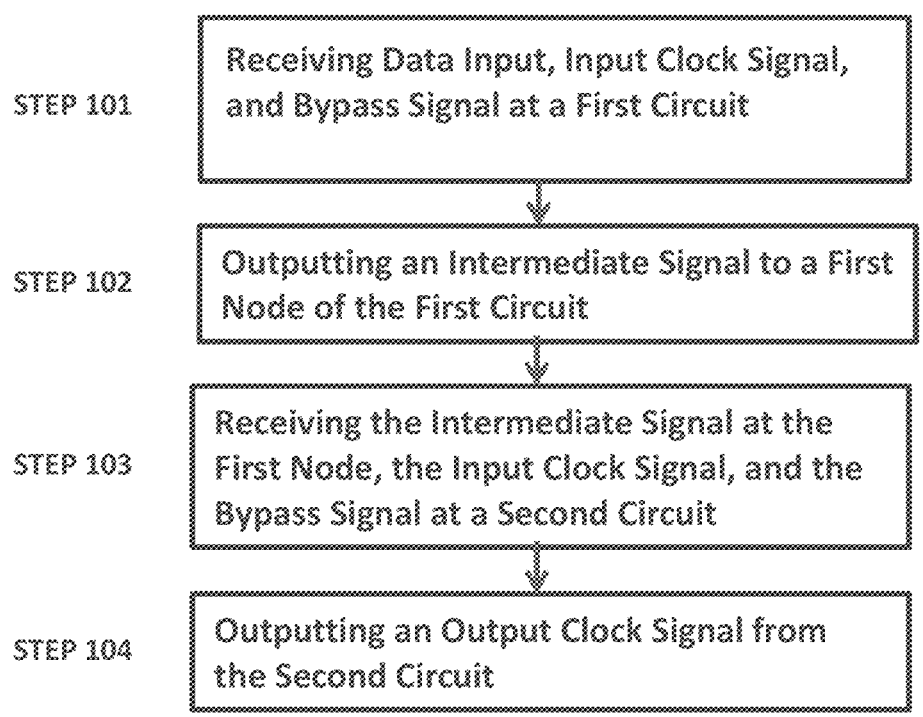
FIG. 5 is a flowchart for the design for test configuration according to an exemplary embodiment.

FIG. 5 is a flowchart for the DFT configuration according to an exemplary embodiment. In Step 101, a first circuit receives a data input, an input clock signal, and a bypass signal at the first circuit. In Step 102, the intermediate signal is output to a first node of the first circuit. In Step 103, the intermediate signal, the input clock signal, and the bypass signal are received at a second circuit. Further, the intermediate signal is received at the first node. Finally, in Step 104, the output clock signal is output from the second circuit. In the exemplary embodiment of FIG. 5, the first circuit and the second circuit may correspond to the master circuit 50 and the slave circuit 70, respectively.

In the flowchart in FIG. 5, a bypass mode may control functions of the first circuit and the second circuit. When the bypass mode is activated, the first circuit may be disabled, the input clock signal in the second circuit may be buffered, and the buffered input clock signal may be output as an output clock signal from the second circuit. The bypass mode may be a mode in which the bypass signal is logic high. However, the inventive concept is not limited thereto, and the bypass mode may be activated when the bypass signal is logic low.

In the flowchart in FIG. 5, a non-bypass mode may control the functions of the first circuit and the second circuit. When the non-bypass mode occurs, a stretched clock signal is output at the output clock signal from the second circuit. The stretched clock signal is stretched in comparison to the input clock signal. The non-bypass mode may be a mode in which the bypass signal is logic low. However, the inventive concept is not limited thereto, and the non-bypass mode may be activated when the bypass signal is logic high.

The steps of the method or algorithm described in connection with the aspects disclosed herein may be embodied directly in hardware, in a software module executed by a processor, or in a combination of hardware and software. A software module may reside in RAM memory, flash memory, ROM memory, EPROM memory, EEPROM memory, registers, a hard disk, a removable disk, a CD-ROM, or any other form of storage medium known in the art. An exemplary storage medium (e.g., memory 40) may be coupled to the processor, such that the processor can read information from, and write information to, the storage medium. In the alternative, the storage medium may be integral to the processor. Further, in some aspects, the processor and the storage medium may reside in an application specific integrated circuit (ASIC). Additionally, the ASIC may reside in a user terminal. Alternatively, the processor and the storage medium may reside as discrete components in a user terminal.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the embodiments. Accordingly, all such modifications are intended to be included within the scope of the embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flip-flop circuit for inserting a zero-delay bypass mux comprising:
   a master circuit which is configured to receive a data input, an input clock signal, and a bypass signal, and output an intermediate signal to a first node; and
   a slave circuit which is configured to receive the input clock signal simultaneously with the bypass signal, to receive the intermediate signal at the first node, and to output an output clock signal,
   wherein in response to a logic level of the bypass signal being set at high, the master circuit is disabled, the intermediate signal is forced logic high, the input clock signal is buffered, and the buffered input clock signal is output as the output clock signal from the slave circuit.

2. The flip-flop circuit of claim 1, wherein the master circuit comprises:
   a bypass PMOS transistor connected between a first voltage source and a third PMOS transistor, and controlled by the bypass signal;
   the third PMOS transistor connected between the bypass PMOS transistor and a second node; and
   a bypass NMOS transistor connected between a third node and ground, and controlled by the bypass signal.

3. The flip-flop circuit of claim 2, wherein the master circuit further comprises:
   a first PMOS transistor connected between the first voltage source and the first node, and controlled by the input clock signal;
   a second PMOS transistor connected between the first voltage source and the first node, and controlled by a second node;
   a first NMOS transistor connected between the first node and a second NMOS transistor, wherein the first NMOS transistor is controlled by the data input;
   a third NMOS transistor connected between the second NMOS transistor and the ground, and controlled by the second node;
   the second NMOS transistor connected between the first NMOS transistor and the third NMOS transistor, and controlled by the input clock signal;
   the third PMOS transistor connected between the bypass PMOS transistor and the second node, and controlled by the input clock signal;
   a fourth PMOS transistor connected between the first voltage source and the second node, and controlled by the intermediate signal;
   a fourth NMOS transistor connected between the first node and a ninth NMOS transistor, and controlled by an inverted signal of the first node;
   a fifth NMOS transistor connected between the second node and the third node, and controlled by the intermediate signal;
   an eighth NMOS transistor connected between the ninth NMOS transistor and the ground, and controlled by the input clock signal.

4. The flip-flop circuit of claim 3, wherein the master circuit further comprises:
  a sixth NMOS transistor connected between the third node and a seventh NMOS transistor, and controlled by an inverted signal of the data input;
  the seventh NMOS transistor connected between the sixth NMOS transistor and the ground, and controlled by the input clock signal; and
  the ninth NMOS transistor connected between the eighth NMOS transistor and the second node, and controlled by an inverted signal of the second node.

5. The flip-flop circuit of claim 1, wherein the slave circuit comprises:
  a fifth node; and
  a bypass NOR gate which is configured to receive the bypass signal and a signal of a sixth node, and output a signal of a fourth node.

6. The flip-flop circuit of claim 5, wherein the slave circuit further comprises:
  a fifth PMOS transistor connected between the first voltage source and a tenth NMOS transistor, and controlled by the intermediate signal of the first node;
  the tenth NMOS transistor connected between the fifth PMOS transistor and an eleventh NMOS transistor, and controlled by the input clock signal;
  the eleventh NMOS transistor connected between the tenth NMOS transistor and ground, and controlled by the intermediate signal;
  a sixth PMOS transistor connected between the first voltage source and a seventh PMOS transistor, and controlled by the signal of the fourth node;
  a seventh PMOS transistor connected between the sixth PMOS transistor and a twelfth NMOS transistor, and controlled by the input clock signal; and
  the twelfth NMOS transistor connected between the seventh PMOS transistor and the fifth node, and controlled by the signal of the fourth node.

7. The flip-flop circuit of claim 6, wherein the slave circuit further comprises:
  an inverter which inverts the signal of the sixth node such that the inverter outputs the output clock signal.

8. The flip-flop circuit of claim 1, wherein the flip-flop circuit is used to test at least one external circuit using the output clock signal.

9. The flip-flop circuit of claim 1, wherein the at least one external circuit is at least one memory circuit.

10. The flip-flop circuit of claim 1,
  wherein in response to the bypass signal being logic low, a stretched clock signal is output as the output clock signal from the slave circuit, and
  wherein the stretched clock signal is stretched in comparison to the input clock signal.

11. A method of inserting a zero-delay bypass mux, the method comprising:
  receiving a data input, an input clock signal, and a bypass signal at a first circuit;
  outputting an intermediate signal to a first node of the first circuit;
  receiving the input clock signal simultaneously with the bypass signal at a second circuit, and receiving the intermediate signal at the first node at the second circuit; and
  outputting an output clock signal from the second circuit;
  disabling the first circuit during a bypass mode;
  forcing the intermediate signal to logic high during the bypass mode;
  buffering the input clock signal in the second circuit during the bypass mode; and
  outputting a buffered input clock signal as the output clock signal from the second circuit during the bypass mode,
  wherein the bypass mode is a mode in which a logic level of the bypass signal is set at high.

12. The method of claim 11, further comprising:
  outputting a stretched clock signal as the output clock signal from the second circuit during a non-bypass mode,
  wherein the stretched clock signal is stretched in comparison to the input clock signal.

13. The method of claim 12, wherein the non-bypass mode is a mode in which the bypass signal is logic low.

14. The method of claim 11, further comprising:
  testing at least one external circuit using the output clock signal.

15. The method of claim 14, wherein the at least one external circuit is at least one memory circuit.

16. A flip-flop circuit comprising:
  a first circuit which receives an input clock signal and outputs an intermediate signal; and
  a second circuit which receives the input clock signal simultaneously with a bypass signal, receives the intermediate signal, and outputs an output clock signal,
  wherein the first circuit comprises:
  a bypass PMOS transistor connected between a voltage source and a first PMOS transistor, and controlled by the bypass signal, and
  a bypass NMOS transistor connected between a first NMOS and ground, and controlled by the bypass signal,
  wherein the second circuit comprises:
  a bypass NOR gate which is configured to receive the bypass signal and a signal of a first node and output a signal of a second node, and
  an inverter which inverts a signal of the first node such that the inverter outputs an output clock signal,
  wherein the signal of the second node is a control input to a second PMOS transistor and a second NMOS transistor of the second circuit,
  wherein in response to a logic level of the bypass signal being set at high, the first circuit is disabled, the intermediate signal is forced logic high, the input clock signal is buffered, and the buffered input clock signal is output as the output clock signal from the second circuit.

17. The flip-flop circuit of claim 16,
  wherein in response to the bypass signal being logic low, a stretched clock signal is output as the output clock signal from the second circuit, and
  wherein the stretched clock signal is stretched in comparison to the input clock signal.

* * * * *